(12) United States Patent
Dan et al.

(10) Patent No.: US 11,367,998 B2
(45) Date of Patent: Jun. 21, 2022

(54) METHOD FOR PREPARING ER- OR ER/O-DOPED SILICON-BASED LUMINESCENT MATERIAL EMITTING COMMUNICATION BAND AT ROOM TEMPERATURE, THE LUMINESCENT MATERIAL AND ER- OR ER/O-SI LASERS

(71) Applicant: Shanghai Jiao Tong University, Shanghai (CN)

(72) Inventors: Yaping Dan, Shanghai (CN); Huimin Wen, Shanghai (CN); Jiajing He, Shanghai (CN)

(73) Assignee: Shanghai Jiao Tong University, Shanghai (CN)

( * ) Notice: Subject to any disclaimer, the term of this patent is extended or adjusted under 35 U.S.C. 154(b) by 123 days.

(21) Appl. No.: 16/762,801

(22) PCT Filed: Dec. 15, 2017

(86) PCT No.: PCT/CN2017/116372
§ 371 (c)(1),
(2) Date: May 8, 2020

(87) PCT Pub. No.: WO2019/113925
PCT Pub. Date: Jun. 20, 2019

(65) Prior Publication Data
US 2020/0366063 A1 Nov. 19, 2020

(51) Int. Cl.
*H01S 5/30* (2006.01)
*C09K 11/77* (2006.01)
(Continued)

(52) U.S. Cl.
CPC ........ *H01S 5/3086* (2013.01); *C09K 11/7707* (2013.01); *C23C 14/48* (2013.01);
(Continued)

(58) Field of Classification Search
CPC .... H01S 5/3086; H01S 5/3224; H01S 3/0632; H01S 3/1608; H01S 3/1628; H01S 2304/00
See application file for complete search history.

(56) References Cited

FOREIGN PATENT DOCUMENTS

CN 1941525 A 4/2007

OTHER PUBLICATIONS

Lourenço, "Super-enhancement of 1.54 μm emission from erbium codoped with oxygen in silicon-on-insulator," Nov. 22, 2016, Sci. Rep. 6, 37501; 37501; doi: 10.1038/srep37501 pp. 1-6. (Year: 2016).*

(Continued)

*Primary Examiner* — Michael Carter
(74) *Attorney, Agent, or Firm* — Osha Bergman Watanabe & Burton LLP

(57) ABSTRACT

A method for preparing an erbium (Er)- or erbium oxygen (Er/O)-doped silicon-based luminescent material emitting a communication band at room temperature. The method comprising the following steps: (a) doping a single crystalline silicon wafer with erbium ion implantation or co-doping the single crystalline silicon wafer with erbium ion and oxygen ion implantation simultaneously to obtain an Er- or Er/O-doped silicon wafer, wherein the single crystalline silicon wafer is a silicon wafer with a germanium epitaxial layer, or an SOI silicon wafer with silicon on an insulating layer or other silicon-based wafers; and (b) subjecting the Er- or Er/O-doped silicon wafer to a deep-cooling annealing treatment, the deep-cooling annealing treatment includes a temperature increasing process and a rapid cooling process.

11 Claims, 3 Drawing Sheets

(51) Int. Cl.
  C23C 14/48    (2006.01)
  C23C 14/58    (2006.01)
  H01S 5/32     (2006.01)
  H01S 3/063    (2006.01)
  H01S 3/16     (2006.01)

(52) U.S. Cl.
  CPC ........ *C23C 14/5806* (2013.01); *H01S 3/0632* (2013.01); *H01S 3/1608* (2013.01); *H01S 3/1628* (2013.01); *H01S 5/3224* (2013.01); *H01S 2304/00* (2013.01)

(56) References Cited

OTHER PUBLICATIONS

Jeng, "Control Strategy for thermal Budget and Temperature Uniformity in Spike Rapid Thermal Processing Systems," Proceedings of the 11th International Symposium on Process Systems Engineering, Jul. 2012. (Year: 2012).*

Xu, Fei et al. "Effect of Erbium Segregation and Precipitation on 1.54μm Light Emission from Erbium-Doped Silicon" Journal of the Chinese Rare Earth Society, vol. 20, No. (1), Feb. 28, 2002 (Feb. 28, 2002), ISSN: 1000-4343 (4 pages).

Li, Yi et al. "Rutherford Backscattering and Luminescence Studies of Er and O Coimplanted Si" Chinese Journal of Luminescence vol. 17, No. 4, Dec. 31, 1996 (Dec. 31, 1996), ISSN: 1000-7032 (5 pages).

Xu, Fei et al. "Photoluminescence Around 1.54μm Wavelength from Erbium-Doped Silicon Dependence on Annealing Temperature" Nuclear Techniques vol. 25, No. 8, Aug. 31, 2002 (Aug. 31, 2002), ISSN: 0253-321 (6 pages).

International Search Report issued in International Application No. PCT/CN2017/116372 dated Sep. 10, 2018 (3 pages).

Written Opinion issued in International Application No. PCT/CN2017/116372 dated Sep. 10, 2018 (5 pages).

* cited by examiner

METHOD FOR PREPARING ER- OR ER/O-DOPED SILICON-BASED LUMINESCENT MATERIAL EMITTING COMMUNICATION BAND AT ROOM TEMPERATURE, THE LUMINESCENT MATERIAL AND ER- OR ER/O-SI LASERS

TECHNICAL FIELD

This disclosure belongs to the field of semiconductor silicon optoelectronic technology, and relates to a new method for processing silicon-based semiconductors, in particular to a method for preparing an Er- or Er/O-doped silicon-based luminescent material.

BACKGROUND

The realization of silicon-based photonic integration technology and silicon-based optoelectronic integration technology can break the bottleneck of current microelectronic technology development. Using silicon-based materials to produce high-quality, high-efficiency room-temperature communication-band luminescent devices is of great significance to optoelectronics and even the entire information technology field. Due to the limitation of the indirect band gap energy band structure, intrinsic silicon materials exhibit very low light-emitting characteristics, and in principle, silicon-based light sources cannot be realized. Currently, research on silicon-based modified materials such as porous silicon, silicon nanocrystals, and erbium (Er) or erbium oxygen (Er/O)-doped silicon has provided some possible ways to achieve silicon emission and even silicon lasers. Among them, Er-doped or Er/O-doped silicon-based luminescent materials have received widespread attention for a long time due to their many advantages, such as their emission wavelengths in the communication band and full compatibility with CMOS processes. However, Er-doped or Er/O-doped silicon materials still have defects such as non-radiative transition quenching at room temperature and extremely low luminescent efficiency, which has become the only technical bottleneck for their industrial applications.

Therefore, it is of great significance to develop a new technology that can greatly improve the luminescent efficiency of Er- or Er/O-doped silicon luminescent materials at room temperature.

SUMMARY

In overcoming the enumerated drawbacks and other limitations of the related art, the present disclosure provides a method for preparing an erbium (Er)- or erbium oxygen (Er/O)-doped silicon-based luminescent material emitting a communication band at room temperature. The present invention adopts an ultra-rapid-cooling annealing technology to prepare an erbium (Er)- or erbium oxygen (Er/O)-doped silicon-based luminescent material to realize a 1.53-μm-wavelength emission with high efficiency at room temperature.

According to one aspect of the present disclosure, the method for preparing an erbium (Er)- or erbium oxygen (Er/O)-doped silicon-based luminescent material emitting a communication band at room temperature, comprising the following steps: (a) doping a single crystalline silicon wafer with erbium ion implantation or co-doping a single crystalline silicon wafer with erbium ion and oxygen ion implantation simultaneously to obtain an Er- or Er/O-doped silicon wafer, wherein the single crystalline silicon wafer is a silicon wafer with a germanium epitaxial layer, or an SOI silicon wafers with silicon on an insulating layer or other silicon-based wafers; and (b) subjecting the Er- or Er/O-doped silicon wafer to a deep-cooling annealing treatment, the deep-cooling annealing treatment includes a temperature increasing process and a rapid cooling process.

Preferably, in step (a), the energy of the erbium ion implantation ranges from 20 keV to 1 MeV, and the dosage range is from $4 \times 10^{14}$ to $4 \times 10^{16}$ cm$^{-2}$. When oxygen ions are also implanted at the same time, the implantation energy range of oxygen ions is from 3 keV to 300 keV, and the dosage range is from $10^{15}$ to $10^{17}$ cm$^{-2}$, respectively.

Preferably, step (b) further comprises:
(b1) performing a high temperature treatment on the Er- or Er/O-doped silicon wafer, and
(b2) performing an ultra-rapid cooling treatment immediately after the high temperature treatment.

Preferably, the Er- or Er/O-doped silicon wafer is electromagnetically heated by an energized copper ring in (b1); and the cooling treatment is exerted by flushing with a low-temperature high purity He gas in (b2).

Preferably, a laser pulse ON phase is adopted for increasing the temperature in step (b1); and wherein a laser pulse OFF phase is adopted for the rapid cooling treatment in step (b2).

Preferably, further comprising a step of depositing a dielectric protection layer on the Er- or Er/O-doped silicon wafer prior to the step (b), and a step of removing the dielectric protection layer after the step (b).

Preferably, a maximum temperature in (b1) reaches 1300° C., and a cooling rate in (b2) is no less than $-200°$ C.·s$^{-1}$, that is, a temperature decrease of more than 200° C. per second.

According to another aspect of the present disclosure, an erbium (Er)— or erbium oxygen (Er/O)-doped silicon-based luminescent material emitting a communication band at room temperature prepared by the aforementioned method is provided.

According to another aspect of the present disclosure, an Er— or Er/O—Si laser is provided, comprising a PIN diode, a micro-disk resonator, and a silicon-based optical waveguide, wherein an I region of the PIN diode is made of the above mentioned erbium (Er)- or erbium oxygen (Er/O)-doped silicon-based luminescent material emitting a communication band at room temperature.

Preferably, the PIN diode is forward-biased to form an electroluminescent device, the micro-disk resonator selects and enhances light waves in the communication band, a luminescence of the electroluminescent device is selected and enhanced by the resonator, and finally a laser is formed and derived from the silicon-based optical waveguide.

The beneficial effect of the present invention is that the high-efficiency room-temperature photoluminescence (PL) of Er- or Er/O-doped silicon materials near 1.53 μm is successfully achieved through the deep-cooling annealing technology, which provides a feasible method for the successful preparation of silicon emitter and laser sources. The entire process is compatible with the existing CMOS process, which has important industrial application value.

DETAILED DESCRIPTION

In the following, numerous specific details are set forth in order to provide a thorough understanding of the invention. The invention may be practiced without some or all of these specific details. In other cases, well-known process operations have not been described in detail in order not to unnecessarily obscure the present invention. Although the present invention will be described in conjunction with specific embodiments, it should be understood that this is not intended to limit the present invention to these embodiments.

Figure 1:
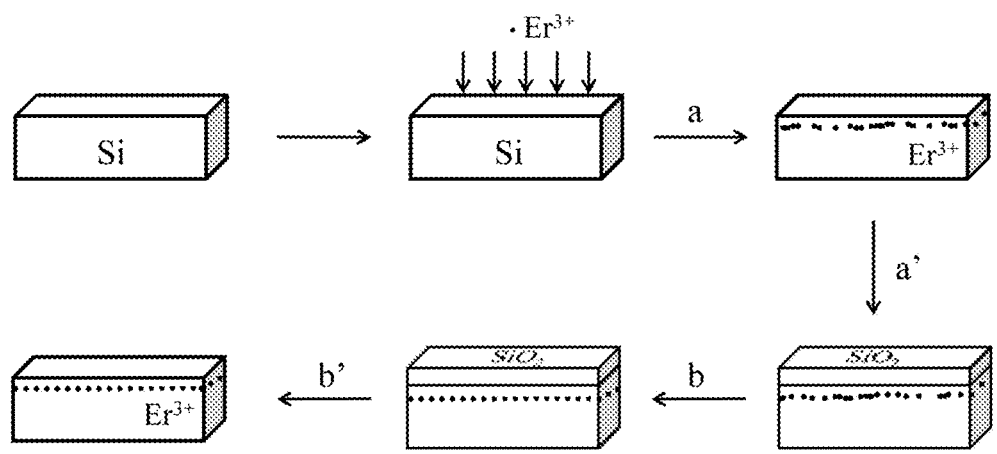
FIG. 1 is a flowchart of the method for preparing an erbium (Er)- or erbium oxygen (Er/O)-doped silicon-based luminescent material emitting a communication band at room temperature according to one embodiment of the invention.

FIG. 1 is a flowchart f of the method for preparing an erbium (Er)- or erbium oxygen (Er/O)-doped silicon-based luminescent material emitting a communication band at room temperature according to one embodiment of the invention. As shown in FIG. 1, the method for preparing an erbium (Er)- or erbium oxygen (Er/O)-doped silicon-based luminescent material according to the present invention includes the following steps.

Step (a): selecting single crystalline silicon wafers as the processing substrates, and implanting Er ions only or co-implanting Er and O ions to obtain Er- or Er/O-doped silicon wafers. In this step, silicon substrates may be FZ single crystalline silicon (100) wafers that are single-slide polished. In other embodiments, other silicon wafers can also be selected, such as a silicon germanium (SiGe) wafer with epitaxial germanium on the surface, an SOI silicon wafer with silicon on an insulation layer, an SOI silicon wafer with epitaxial germanium. Also, in this step, the implantation energy and dosage of Er ions are 20 keV~1 MeV and $4 \times 10^{14}$~$4 \times 10^{16}$ cm$^{-2}$, respectively. Their preferred values are 200 keV and $4 \times 10^{15}$ cm$^{-2}$, respectively. When co-implanting oxygen ions simultaneously, its implantation energy ranges from 3 keV to 300 keV and the dosage is from $10^{15}$ to $10^{17}$ cm$^{-2}$. Preferably, their values are 30 keV and $10^{16}$ cm$^{-2}$, respectively. A simulation exhibits that the implanted Er ions (or both Er and O ions) mainly distribute at ~70 nm below silicon surfaces. An LC-4 ion implanter may be employed to implant Er and O ions into FZ silicon wafers.

Step (b): subjecting the Er- or Er/O-doped silicon wafer to a deep-cooling annealing treatment, the deep-cooling annealing treatment includes a temperature increasing process and a rapid cooling process. This step further includes: (b1) performing a high temperature treatment on the Er- or Er/O-doped silicon wafer, and (b2) performing an ultra-rapid cooling treatment immediately after the high temperature treatment.

Figure 2:
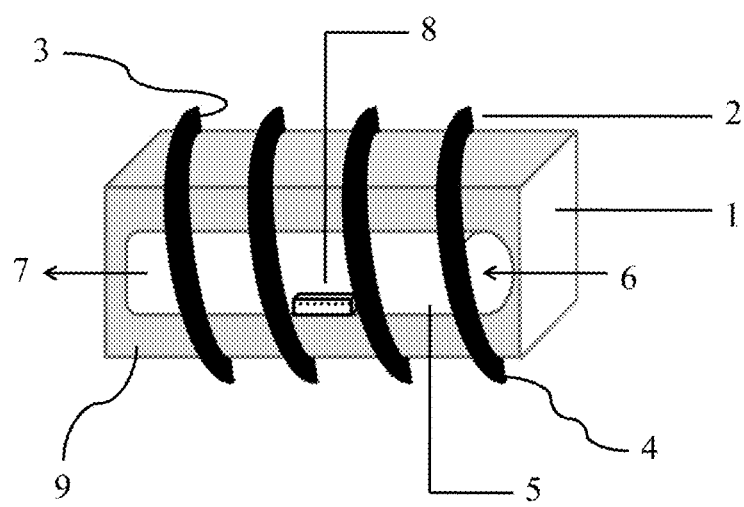
FIG. 2 is a schematic structural diagram of the deep-cooling annealing apparatus according to one embodiment of the present invention.

A preferable embodiment of the deep-cooling annealing treatment is as follows. In step b1, an energized copper ring is used to electromagnetically heat the Er- or Er/O-doped silicon wafer. In step b2, a low-temperature helium gas is used for ultra-rapid cooling treatment. The low-temperature helium gas can be obtained by cooling with liquid nitrogen (77K) or other low-temperature liquids. Specifically, the deep-cooling annealing process may be performed by a deep-cooling annealing apparatus as shown in FIG. 2. This apparatus can use improved expansion coefficient measuring equipment, such as, based on the American TA instrument DIL 805 thermal expansion phase change instrument with its cavity appropriately modified. The deep-cooling annealing apparatus specifically includes: an outer stainless-steel sleeve 1 surrounded by an energized copper ring 2 having an alternating current input terminal 3 and an output terminal 4; and an inner quartz sleeve 5 formed in the outer stainless-steel sleeve 1. The inner quartz sleeve 5 forms a cavity in which an Er- or Er/O-doped silicon wafer sample is placed. The cavity has an inert gas inlet 6 and an inert gas outlet 7. The energized copper ring 2 heats the outer stainless steel sleeve 1 to perform a high-temperature treatment on the Er- or Er/O-doped silicon wafer sample 8. The cavity is kept under vacuum, and the maximum temperature can reach 1300° C. The inert gas can be helium, specifically low-temperature, high-purity helium (for example, a concentration of 99.999%). The sample can be subjected to a contact ultra-rapid cooling process, and the cooling rate is greater than $-200°$ C.·s$^{-1}$, that is, a temperature decrease of more than 200° C. per second. After a large number of experimental data screening, the optimal deep-cooling conditions for Er- or Er/O-doped silicon wafer are 950° C. for 5 minutes. The average temperature decrease of helium cooling is faster than $-200°$ C.·s$^{-1}$ with a duration of about 5 s.

Wherein, the inner diameter of the outer sleeve of the apparatus is ≈5 mm; the inner diameter of the inner sleeve is ≈3 mm, and the wall thickness is ≈0.4 mm. For industrial applications, similar equipment can be customized with larger cavities to handle large semiconductor wafers, such as 12-inch wafers. In addition, a thermocouple 9 is provided on the outer sleeve, for example, by welding, which is used for accurate temperature control by feedback detection during the temperature increasing and decreasing process. The thermocouple model can be K type with a diameter of 0.25 mm.

In a preferred embodiment, the method for preparing an erbium (Er)- or erbium oxygen (Er/O)-doped silicon-based luminescent material further includes: a Step a' of sputtering a protection layer on the erbium (Er)- or erbium oxygen (Er/O)-doped silicon substrate prior to step b, and a step b' of removing the protective layer after step b. The protective layer may be, for example, a SiO2 film (or Si3N4, HfO2, etc.). Here, Delton multi-target magnetron sputtering equipment can be used for SiO2 reactive sputtering, or atomic layer deposition method can be used to deposit SiO2 and other dielectric materials on the surface of the sample. Specifically, the erbium (Er)- or erbium oxygen (Er/O)-doped silicon wafer can be subjected to SiO2 thin film sputtering on both sides, and the SiO2 thin film layer is about 200 nm. When the protective layer is removed, the SiO2 etching solution may be an HF aqueous solution (mass fraction: 5%).

As mentioned above, in the above-mentioned deep-cooling technology of the present invention, the three factors of a quartz sleeve, a silicon wafer blocking protective layer (200 nm of SiO2 film thickness on the front and back surfaces), and a vacuum atmosphere of the cavity (during high temperature treatment, the vacuum degree can reach $5 \times 10^{-4}$ mbar) work together to completely eliminate the possible adverse effects of contamination sources in the cavity on the erbium (Er)- or erbium oxygen (Er/O)-doped silicon wafers during the deep-cooling process.

In addition, in the above-mentioned deep-cooling technology of the present invention, helium gas sufficiently cooled by liquid nitrogen is used to perform a contact ultra-rapid cooling treatment on the erbium (Er)- or erbium oxygen (Er/O)-doped silicon wafers, and the temperature decrease rate is greater than $-200°$ C.·s$^{-1}$, such as $-300°$ C.·s$^{-1}$, and the rate can be as high as $-1000°$ C.·s$^{-1}$ or even higher. The high cooling rate can quickly freeze the erbium ions in the silicon body at the photoactive position, and solve the problem of low luminous efficiency caused by the phenomenon that the erbium ions are easily agglomerated and clustered in the traditional high temperature annealing process. The ultra-low boiling point helium (4.2 K, 1 bar) can be maintained in the gas state after being cooled by liquid nitrogen, thereby ensuring that the target sample is cooled more fully and efficiently. As an inert gas, nitrogen or other atmospheres can completely avoid unavoidable pollution to the silicon wafer when the temperature is lowered. In the process of temperature increasing and decreasing, the temperature of the cavity is detected in real time by the welded K-type thermocouple and fed back to the temperature control instrument to ensure accurate temperature control.

Another preferred embodiment of the deep-cooling annealing treatment is to adopt a laser pulse ON phase to increase the temperature in step b1, and adopt a laser pulse OFF phase for the rapid cooling treatment of the erbium (Er)- or erbium oxygen (Er/O)-doped silicon wafers in step b2. The laser pulse can be generated, for example, using a pulsed KrF excimer laser with a wavelength of 248 nm, a pulse time of 25 ns, an energy density of 250 mJ/pulse, and a frequency of 10 Hz.

Figure 3A:
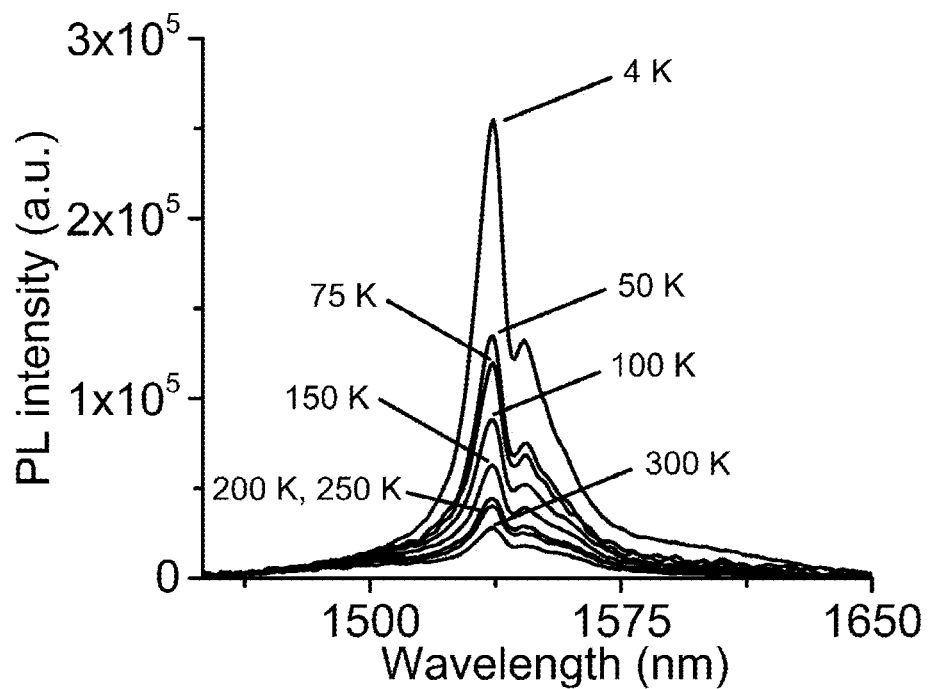
FIG. 3(a) is a temperature dependence diagram of a photoluminescence spectrum of the Er/O-doped silicon-based materials according to the present invention.
Figure 3B:
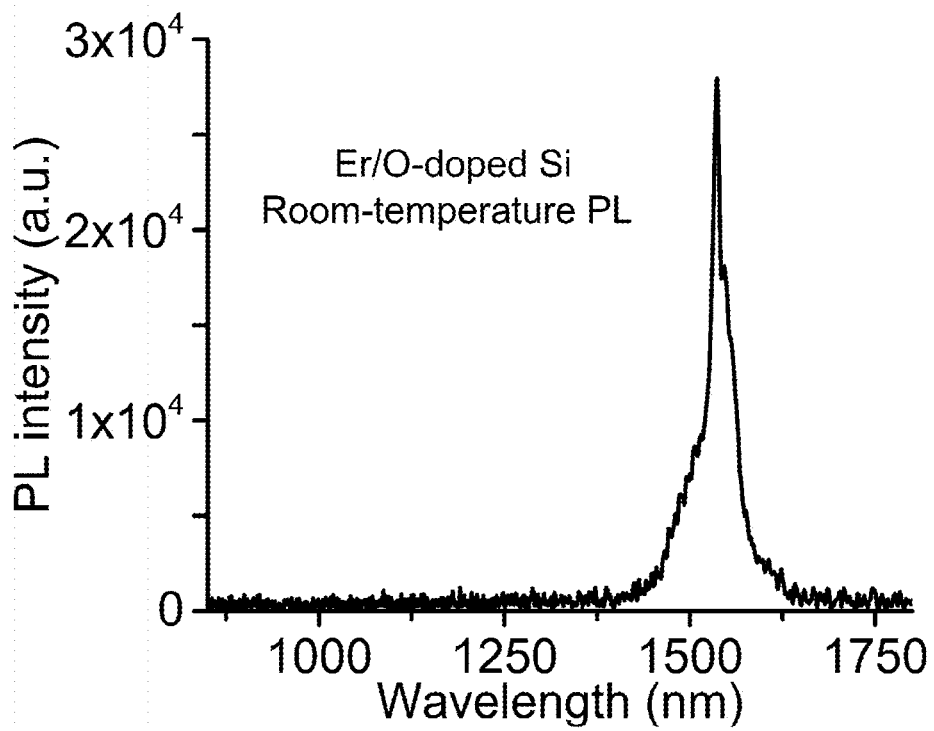
FIG. 3(b) is the photoluminescence spectrum of the Er/O-doped silicon-based materials in FIG. 3(a) at a temperature of 300K.

FIG. 3($a$) is a temperature dependence diagram of a photoluminescence spectrum of the Er/O-doped silicon-based luminescent materials according to the present invention. The horizontal axis is the wavelength, and the vertical axis is the light intensity. The unit is an arbitrary unit (a.u). FIG. 3($b$) is the photoluminescence spectrum of the Er/O-doped silicon materials in FIG. 3($a$) at a temperature of 300K. The photoluminescence and temperature change results of erbium (Er)- or erbium oxygen (Er/O)-doped silicon-based luminescent material were measured by a Bruker Fourier transform infrared spectrometer. The spectrometer model was IFS-80v, the detector was a Ge detector, and the operating temperature was 77 K. The light source is a semiconductor laser light source, the laser model is MLL-III-405, the wavelength is 405±5 nm, and the maximum output power is 300 mW. As the temperature decreases, the emitted light intensity increases continuously. This is due to the continuous improvement of the internal quantum efficiency of silicon, but the quantum efficiency generally does not exceed 100%. Generally, it can be considered that when the temperature drops to a few K, the internal quantum efficiency when the luminous efficiency is the highest approaches 100%.

Figure 4:
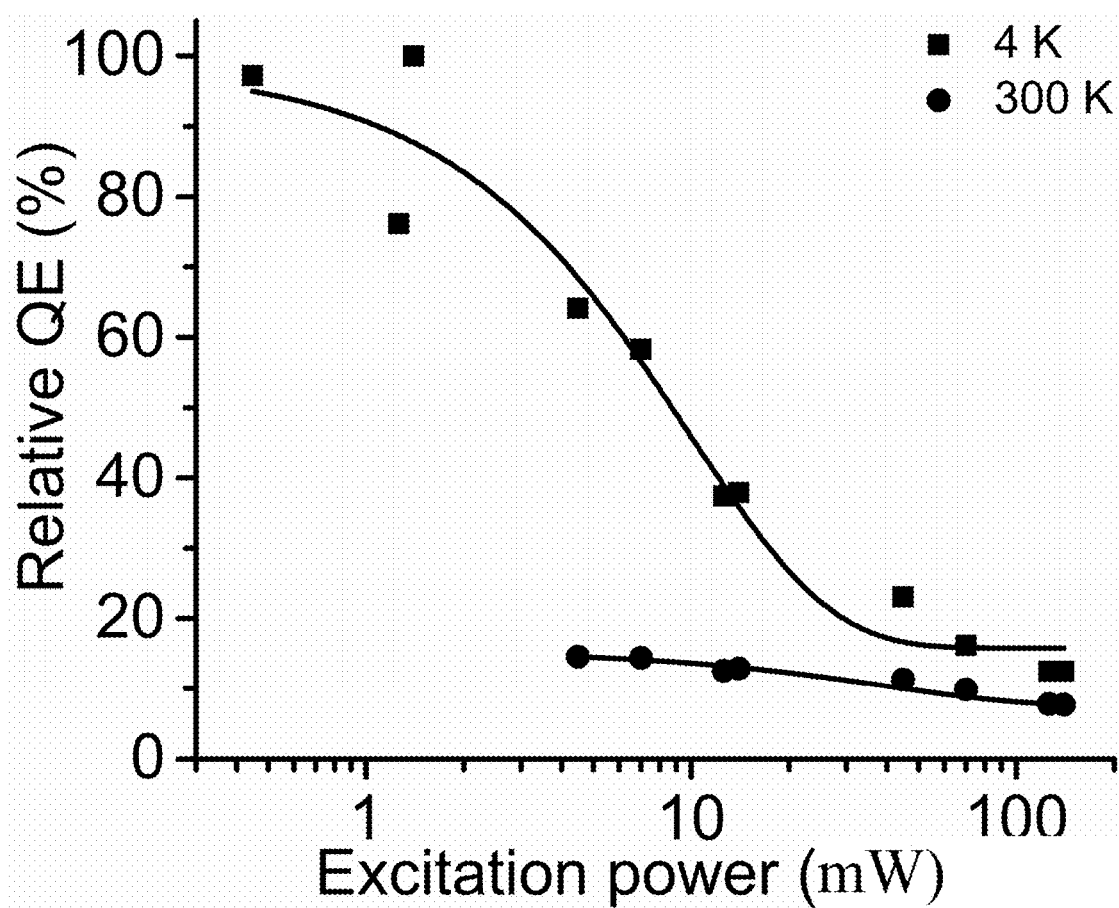
FIG. 4 is a graph of the quantum efficiency (QE) of erbium oxygen (Er/O)-doped silicon-based luminescent material emitting a communication band of the present invention.

FIG. 4 is a graph of the quantum efficiency of the erbium oxygen (Er/O)-doped silicon-based luminescent material of the present invention. The quantum efficiency of erbium oxygen (Er/O)-doped silicon-based luminescent material can be calculated by referring to S. Watanabe, et al. Applied Physics Letters 2003, 83, 4906. As shown in FIG. 4, it is assumed that at a temperature of 4K, the erbium oxygen (Er/O)-doped silicon-based luminescent material has an internal quantum efficiency close to 100% when the luminous efficiency is the highest. When the temperature is raised to room temperature 300K with other parameters remaining unchanged, the luminous efficiency was reduced by about 7 times, so the quantum efficiency at room temperature of the erbium oxygen (Er/O)-doped silicon-based luminescent material was about 14%. However, the internal quantum efficiency of the erbium (Er)- or erbium oxygen (Er/O)-doped silicon materials without ultra-rapid cooling is usually less than 1%, which indicates that ultra-rapid cooling can greatly improve the internal quantum efficiency of the erbium (Er)- or erbium oxygen (Er/O)-doped silicon materials at room temperature, which makes it possible to develop a silicon-based laser that emits light efficiently at room temperature.

Figure 5:
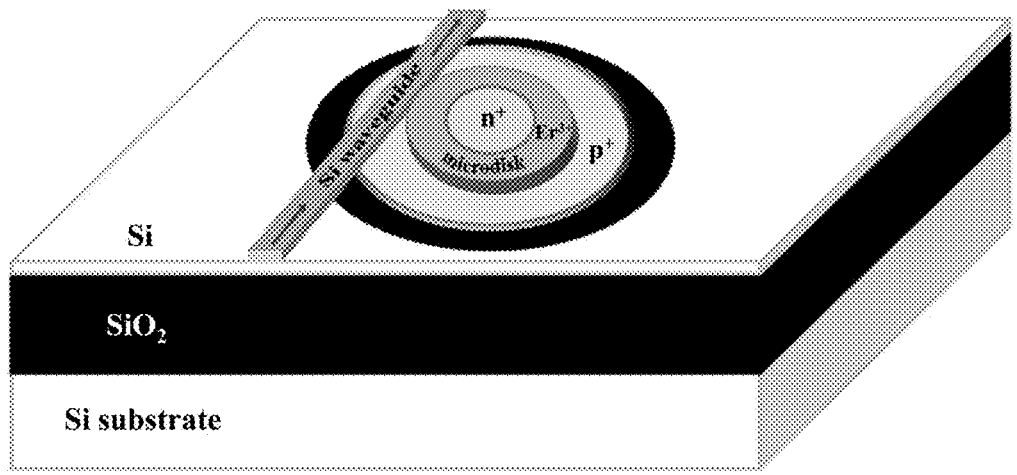
FIG. 5 is a schematic structural diagram of the erbium (Er)- or erbium oxygen (Er/O)-doped silicon-based laser according to one embodiment of the present invention.

FIG. 5 is a schematic structural diagram of an erbium (Er)- or erbium oxygen (Er/O)-doped silicon laser according to an embodiment of the present invention. As shown in FIG. 5, an erbium (Er)- or erbium oxygen (Er/O)-doped silicon-based laser includes a silicon-based PIN diode, a micro-disk resonator, and a silicon-based optical waveguide. An I region of the PIN diode is made of the above-mentioned erbium (Er)- or erbium oxygen (Er/O)-doped silicon-based luminescent material. The PIN diode is forward-biased to form an electroluminescent device, the micro-disk resonator selects and enhances light waves in the communication band, a luminescence of the electroluminescent device is selected and enhanced by the resonator, and finally a laser is formed and derived from the silicon-based optical waveguide. In this embodiment, the silicon-based PIN diode is integrated with the micro-disk resonator. The current flow direction of the PIN diode is the radial direction of the disk. The erbium (Er)- or erbium oxygen (Er/O)-doped silicon-based light-emitting regions (I region) form a ring shape (only erbium-doped silicon-based light-emitting regions are shown in FIG. 5). In other embodiments, the PIN diode and the resonator may have other shapes. The silicon-based optical waveguide is used to couple and export the laser light emitted by the PIN diode and the resonator. In this embodiment, a PIN diode, a disc resonator, and a silicon-based optical waveguide are formed on an SOI silicon wafer. The SOI silicon wafer is a silicon wafer on which a silicon is on an insulation layer (as shown in FIG. 5, three layers including silicon, silicon dioxide and silicon substrate). In an erbium (Er)- or erbium oxygen (Er/O)-doped silicon-based laser, the holes injected from the P region and electrons injected from the N region are recombined in the intrinsic region through the energy level of the erbium ion, thereby exciting photons in the communication band. Due to the filtering effect of high-quality disc resonators, it is difficult to enhance photons outside the set center wavelength (for example, 1536 nm) in the resonator.

The technical content and technical features of the present invention have been disclosed as above. However, those skilled in the art may still make various substitutions and modifications based on the teaching and disclosure of the present invention without departing from the spirit of the present invention. Therefore, the protection scope of the present invention should not be limited to the content disclosed in the embodiments, but should include various substitutions and modifications that do not depart from the present invention, and are covered by the claims of this patent application.

What is claimed is:

1. A method for preparing an erbium (Er)- or erbium oxygen (Er/O)-doped silicon-based luminescent material emitting a communication band at room temperature, comprising the following steps:
   (a) doping a single crystalline silicon wafer with erbium ion implantation or co-doping the single crystalline silicon wafer with erbium ion and oxygen ion implantation simultaneously to obtain an Er- or Er/O-doped silicon wafer, wherein the single crystalline silicon wafer is a silicon wafer with a germanium epitaxial layer, or an SOI silicon wafer with silicon on an insulating layer or other silicon-based wafer; and
   (b) subjecting the Er- or Er/O-doped silicon wafer to a deep-cooling annealing treatment,
      wherein the deep-cooling annealing treatment includes a temperature increasing process and an ultra-rapid cooling process that includes a cooling rate of greater than $-200°$ C. $s^{-1}$.

2. The method according to claim 1, wherein the erbium ion implantation is performed with an energy range of from 20 keV to 1 MeV, and a dosage range of from $4\times10^{14}$ to $4\times10^{16}$ cm$^{-2}$; and wherein the oxygen ion implantation is performed with an energy range of from 3 keV to 300 keV, and a dosage range of from 1015 to 1017 cm$^{-2}$ when co-doping with erbium ion and oxygen ion implantation.

3. The method according to claim 1, wherein the step (b) further comprises:
   (b1) performing a high temperature treatment on the Er- or Er/O-doped silicon wafer, and
   (b2) performing the ultra-rapid cooling treatment immediately after the high temperature treatment.

4. The method according to claim 3, wherein the Er- or Er/O-doped silicon wafer is electromagnetically heated by an energized copper ring in (b1); and wherein the ultra-rapid cooling treatment is performed by flushing with a low-temperature high purity He gas in (b2).

5. The method according to claim 3, wherein a laser pulse ON phase is adopted for increasing a temperature in step (b1); and wherein a laser pulse OFF phase is adopted for the ultra-rapid cooling treatment in step (b2).

6. The method according to claim 3, wherein a maximum temperature in (b1) reaches 1300° C.

7. The method according to claim 1, further comprising a step of depositing a dielectric protective layer on a surface of the Er- or Er/O-doped silicon wafer prior to the step (b), and a step of removing the dielectric protective layer after step (b).

8. The method according to claim 1, wherein the temperature increasing process includes a temperature of 950° C. for 5 minutes.

9. An erbium (Er)- or erbium oxygen (Er/O)-doped silicon-based luminescent material emitting a communication band at room temperature, prepared by the method according to claim 1.

10. An Er- or Er/O-Si laser, comprising a PIN diode, a micro-disk resonator, and a silicon-based optical waveguide, wherein an I region of the PIN diode is made of the erbium (Er)- or erbium oxygen (Er/O)-doped silicon-based luminescent material emitting a communication band at room temperature according to claim 9.

11. The Er— or Er/O—Si laser according to claim 10, wherein the PIN diode is forward-biased to form an electroluminescent device, the micro-disk resonator selects and enhances light waves at the communication band, a luminescence of the electroluminescent device is selected and enhanced by the micro-disk resonator, and a laser is formed and derived from the silicon-based optical waveguide.

* * * * *